United States Patent [19]

Groechel et al.

[11] Patent Number: 5,308,417
[45] Date of Patent: May 3, 1994

[54] UNIFORMITY FOR MAGNETICALLY ENHANCED PLASMA CHAMBERS

[75] Inventors: David W. Groechel; Masato M. Toshima, both of Sunnyvale; Robert J. Steger, Cupertino; Jerry Y. Wong, Fremont, all of Calif.; Tetsuya Ishikawa, Funabashi, Japan; Regga Tekeste, San Jose, Calif.; Koichi Ito, Narita; Tetsuhiko Sambei, Tomisato, both of Japan

[73] Assignee: Applied Materials, Inc., Santa Clara, Calif.

[21] Appl. No.: 758,670

[22] Filed: Sep. 12, 1991

[51] Int. Cl.⁵ .............................. H01L 21/00
[52] U.S. Cl. .............................. 156/643; 156/345; 118/723 MA; 118/723 E; 204/298.37; 204/298.15; 204/192.32; 204/192.12
[58] Field of Search .............. 156/345, 643; 118/723; 427/38; 204/298.37, 298.16, 298.15, 192.32, 192.12

[56] References Cited

U.S. PATENT DOCUMENTS

| 4,842,683 | 6/1989 | Cheng et al. ............... 156/643 |
| 4,919,783 | 4/1990 | Asamaki et al. ............ 204/298.16 |
| 5,016,564 | 5/1991 | Nakamura et al. .......... 204/298.37 |
| 5,079,481 | 1/1992 | Moslehi ..................... 315/111.41 |
| 5,082,542 | 1/1992 | Moslehi et al. ............. 156/643 |
| 5,097,430 | 3/1992 | Birang ....................... 156/626 |

FOREIGN PATENT DOCUMENTS

| WO91/11018 | 7/1991 | European Pat. Off. . |
| 58-025236 | 2/1983 | Japan . |
| 62-263637 | 11/1987 | Japan . |
| 63-243286 | 10/1988 | Japan . |
| 1-057622 | 3/1989 | Japan . |
| 1-130528 | 5/1989 | Japan . |

OTHER PUBLICATIONS

"The American Heritage Dictionary of the English Language"; ed. William Morris; Houghton Mifflin Co.; p. 965.

Primary Examiner—Brian E. Hearn
Assistant Examiner—George Goudreau
Attorney, Agent, or Firm—John A. Frazzini

[57] ABSTRACT

A plasma reactor containing within the processing chamber pieces of magnetic material located to reduce and/or substantially eliminate systematic processing rate nonuniformities. These pieces are placed inside the chamber or attached inside of the pedestal adjacent to the top of the pedestal, where the wafer is to be located for processing. The thickness, shape and magnetic permeabilities of these magnetic pieces are selected to optimize process uniformity.

14 Claims, 8 Drawing Sheets

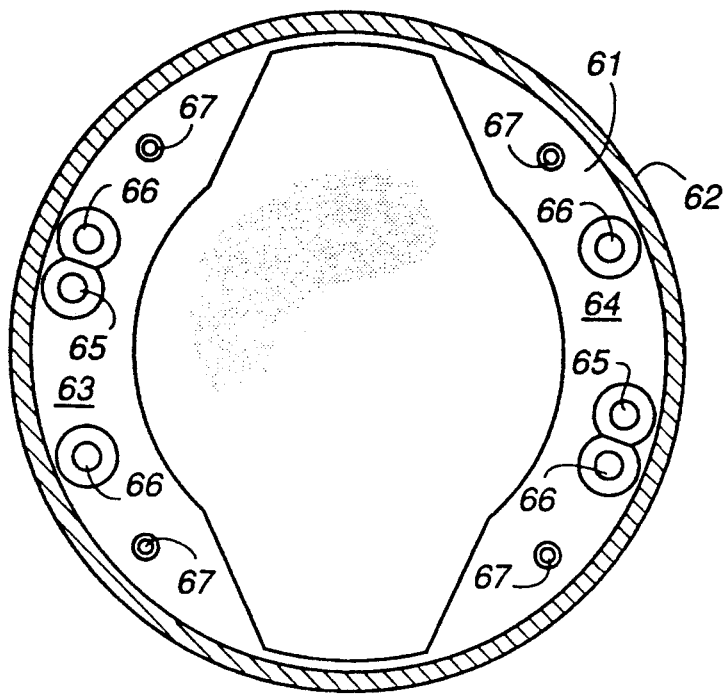
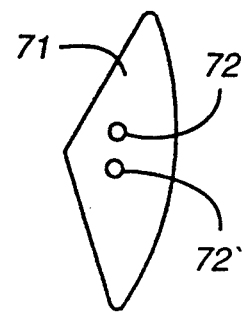
Figure 7
Figure 6
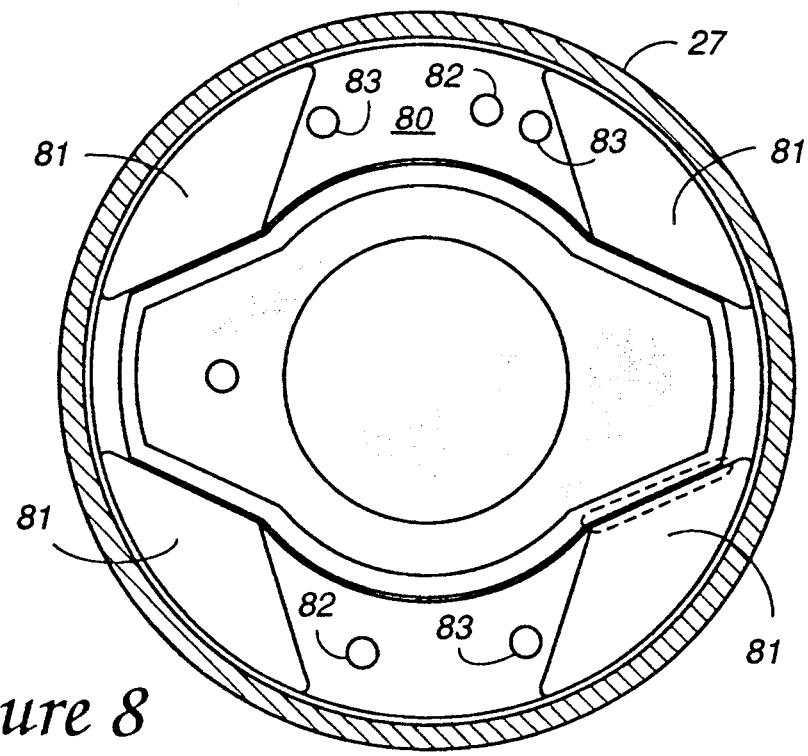
Figure 8

UNIFORMITY FOR MAGNETICALLY ENHANCED PLASMA CHAMBERS

BACKGROUND OF THE INVENTION

This invention relates in general to a magnetically enhanced wafer processing system and relates more particularly to a wafer processing plasma reactor in which the processing rate at the wafer is adjusted by means of magnetic material included within the reactor processing chamber.

Plasma processing, such as plasma etching and deposition processing, in the fabrication of circuits is attractive because it can be anisotropic, can be chemically selective and can produce processing under conditions far from thermodynamic equilibrium. Anisotropic processing enables the production of integrated circuit features having sidewalls that extend substantially vertically from the edges of a the masking layer. This is important in present and future ULSI devices in which the depth of etch and feature size and spacing are all comparable.

In FIG. 1 is shown a typical wafer processing plasma reactor 10. This reactor includes a metal wall 1 1 that encloses a plasma reactor chamber 12. Wall 11 is grounded and functions as one of the plasma electrodes. Gases are supplied to chamber 12 from a gas source 13 and are exhausted by an exhaust system 14 that actively pumps gases out of the reactor to maintain a low pressure suitable for a plasma process. An rf power supply 15 connected to a second (powered) electrode 16 capacitively couples power into a plasma in chamber 12. A wafer 17 is positioned on or near powered electrode 16 for processing. Wafers 17 are transferred into and out of reactor chamber 12 through a port such as slit valve 18.

A plasma consists of two qualitatively different regions: a quasineutral, equipotential conductive plasma body 19 and a boundary layer 110 called the plasma sheath. The plasma body consists of substantially equal densities of negative and positive charged particles as well as radicals and stable neutral particles. RF power coupled into the reactor chamber couples energy into the free electrons, imparting sufficient energy to many of these electrons that ions can be produced through collisions of these electrons with gas molecules. The plasma sheath is an electron deficient, poorly conductive region in which the gradient in the space potential (i.e., the electric field strength) is large. The plasma sheath forms between the plasma body and any interface such as the walls and electrodes of the plasma reactor chamber.

When the powered electrode is capacitively coupled to the rf power source, a negative dc component $V_{dc}$, of the voltage at this electrode (i.e., the dc bias) results (see, for example, H. S. Butler and G. S. Kino, Physics of Fluids, 6, p. 1348 (1963). This dc component, typically several hundred volts, is a consequence of the unequal electron and ion mobilities and the inequality of the sheath capacitances at the electrode and wall surfaces.

The dc component of the sheath potential at the powered electrode is useful in accelerating ions to higher energy in a direction substantially perpendicular to the powered electrode. Therefore, a wafer 17, to be processed by ions from the plasma, is positioned on or slightly above the powered electrode 16 so that this flux of positive ions is incident substantially perpendicular to the plane of the wafer.

The process rate is dependant on the dc component of the sheath potential and on the density of ions in the plasma near the sheath. To achieve high process throughput, it is advantageous to have an increased density of ions near this sheath. One method of increasing plasma ion density near the wafer utilizes magnets to produce a magnetic containment field that traps electrons within the vicinity of the wafer, thereby increasing the ion production rate and associated density at the wafer. The magnetic containment field confines energetic electrons by forcing them to spiral along helical orbits about the magnetic field lines, caused by a Lorentz force $\vec{F} = q(\vec{E} + \vec{v} \times \vec{B})$, where $\vec{E}$ is the electric field vector and $\vec{B}$ is the magnetic field vector. Unfortunately, nonuniformities of the magnetic containment field of such "magnetically enhanced" plasma processing systems result in increased nonuniformity over the surface of the wafer.

To reduce the spatial variation of process rate uniformity over the surface of the wafer, some systems, such as the model 5000E from Applied Materials, Inc., produce a magnetic field that is substantially parallel to the surface of the wafer along a direction that rotates around an axis that is concentric with and perpendicular to the wafer. This rotation produces at the wafer surface an approximately cylindrically symmetric time-averaged field that has improved average uniformity over the wafer, thereby producing improved process uniformity.

Although the rotating magnetic field is to produce a uniform processing rate across the entire surface of the wafer, tests of the process rate at various points of the wafer exhibit some significant nonuniformity. It is therefore advantageous to identify the source of this nonuniformity and to provide a mechanism for eliminating or compensating for this nonuniformity.

SUMMARY OF THE INVENTION

To produce a more uniform etch rate, magnetic material is incorporated into the processing chamber to adjust the strength and/or direction of the magnetic field within the processing chamber. Electrons in a plasma spiral around magnetic field lines so that the strength and direction of the field lines in the plasma chamber affect the rate of processing at the wafer. Any magnetic material can be used to adjust the direction and strength of the magnetic field within the chamber, but ferromagnetic material will usually be utilized because a smaller volume of such material is needed for a given adjustment to the magnetic field lines.

Although this magnetic material could be placed at a number of locations in the chamber to adjust the magnetic field in the processing chamber, in the preferred embodiment, this magnetic material is placed inside of the pedestal because the close proximity of this material to the wafer enables fine tuning of the rate of processing at each point of the wafer and, because the enclosing pedestal prevents the plasma from reacting with this magnetic material, the presence of such magnetic material in the chamber will not contribute unwanted contamination into the wafer process. The effect on the magnetic field near the wafer is dependent on the thickness of the added magnetic material, the magnetic permeability constant of the added magnetic material, and the spacing of this added magnetic material from the top surface of the wafer.

In the preferred embodiment, a ring of magnetic material is embedded into the pedestal to position magnetic material into the pedestal primarily under the two sides of the wafer where increased processing rate is observed. To compensate for the extra high process rates in the four corners of FIG. 3, a corner block of magnetic material is inserted into each of these four corners of the pedestal. In other embodiments, this magnetic material could take the form of a single block of material having a variation in height and/or thickness to produce the desired effect on processing rate uniformity. The thickness, height and/or permeability could be varied continuously to produce a smoother effect on the processing rate distribution than is produced by the ring and the four corner blocks discussed above. However, this embodiment using five blocks of material is easily manufactured by machining and can be assembled nearly as easily as an embodiment in which all of the magnetic material is in one unitary block. Also, a reactor incorporating these five blocks of magnetic material exhibits substantially random spatial variation in the processing rate, thereby indicating that these five blocks have substantially eliminated the systematic process nonuniformities in the processing rate. Therefore, any expense needed to produce a unitary block with smooth variation of thickness and magnetic permeability may not be justified.

In the preferred embodiment, a low magnetic permeability material, such a nickel or nickel alloys, is utilized for both the ring of magnetic material and the four corner blocks. This results in blocks that are thick enough that they can be assembled without careful handling and yet are thin enough that they fit within conventional pedestals. For higher magnetic permeability materials, the desired permeability-thickness product could be achieved by other methods such as coating processes or alloying processes.

The distribution of magnetic material was determined empirically, but in general, as can be seen from the above discussion, the magnetic material is inserted into the reactor chamber in regions adjacent to regions of higher than average etch rate. It is believed that the following analysis explains why this positioning of magnetic material improves process uniformity. This analysis also assists in estimating the desired distribution of magnetic material to improve processing uniformity.

As indicated in the Background of the Invention, a magnetic containment field is included within the reactor chamber to trap electrons within the vicinity of the wafer so that ion production rate and associated density at the wafer are increased. In general, these electrons spiral around the magnetic field lines with a radius R equal to mv/qB, where m is the electron mass, v is the component of the electron velocity perpendicular to the direction of the magnetic field a' that electron, q is the charge of the electron and B is the magnitude of the magnetic field. An increased value of B at any given point reduces the radius R of the spiral, thereby reducing the chance that this electron will be lost, for example, by impact with a wall of the reactor. Because these electrons are responsible for ion production, a local reduction of electron loss will increase the local concentration of ions, thereby increasing the local rate of processing. Conversely, to reduce processing rate within regions of higher than average process rate, the rate of loss of electrons should be increased. This can be achieved by reducing the magnitude of the magnetic field.

Magnetic field lines tend to concentrate into bodies of magnetic material. That this is true is illustrated by an iron yoke placed across the poles of a horseshoe magnet. When no yoke is present, the magnetic field lines spread out from the North pole in a broad region that concentrates back into the South pole of the magnetic. However, when the iron yoke is placed across these two poles, the magnetic field lines from the North pole are drawn into the iron material so that most of the magnetic field exiting the North pole returns to the South pole through the iron yoke. Similarly, by positioning magnetic material adjacent to regions of higher than average process rate, some of the magnetic field adjacent to such magnetic material is drawn into this material, thereby spreading apart the remaining field lines adjacent to this material and producing a reduced strength of magnetic field. This reduces the magnetic confinement of electrons in that region adjacent to the magnetic material, thereby reducing the ionization in that region. This reduced ionization in turn results in a reduced process rate adjacent to such magnetic material. However, not only does the presence of such magnetic material reduce the strength of the magnetic field adjacent to such material, it also changes the direction of such magnetic field. This change in direction can also be chosen to reduce local ionization, for example, by redirecting the local magnetic field so that the spiralling electrons spiral toward a wall or other feature that can draw off such electrons or so that the spiraling radius increases sufficiently to significantly increase collisions of these spiralling ions and/or electrons with the wall or other feature at which they are lost from the plasma. Conversely, magnetic material can also be placed within the chamber to increase local ionization, for example, by changing the local direction of the magnetic field to reduce the spiralling radius and/or redirect these charged particles to reduce losses.

DESCRIPTION OF THE FIGURES

FIGS. 2A, 5A and 5B illustrate a wafer processing plasma reactor that includes magnetic material in the processing chamber to improve process uniformity.

FIG. 6 illustrates a ring of magnetic material that is embedded into a processing chamber pedestal to correct for a magnetic field nonuniformity caused in part by an unequal width and length of the reactor.

FIG. 7 illustrates a corner block of magnetic material that is embedded into a processing chamber pedestal to correct for a magnetic field nonuniformity apparently inherent in a rotating magnetic field produced by two pairs of perpendicular coils.

FIG. 8 illustrates the underside of a pedestal cap that has been modified to enable inclusion of the ring and corner blocks of magnetic material.

DESCRIPTION OF THE PREFERRED EMBODIMENT

Figure 1:
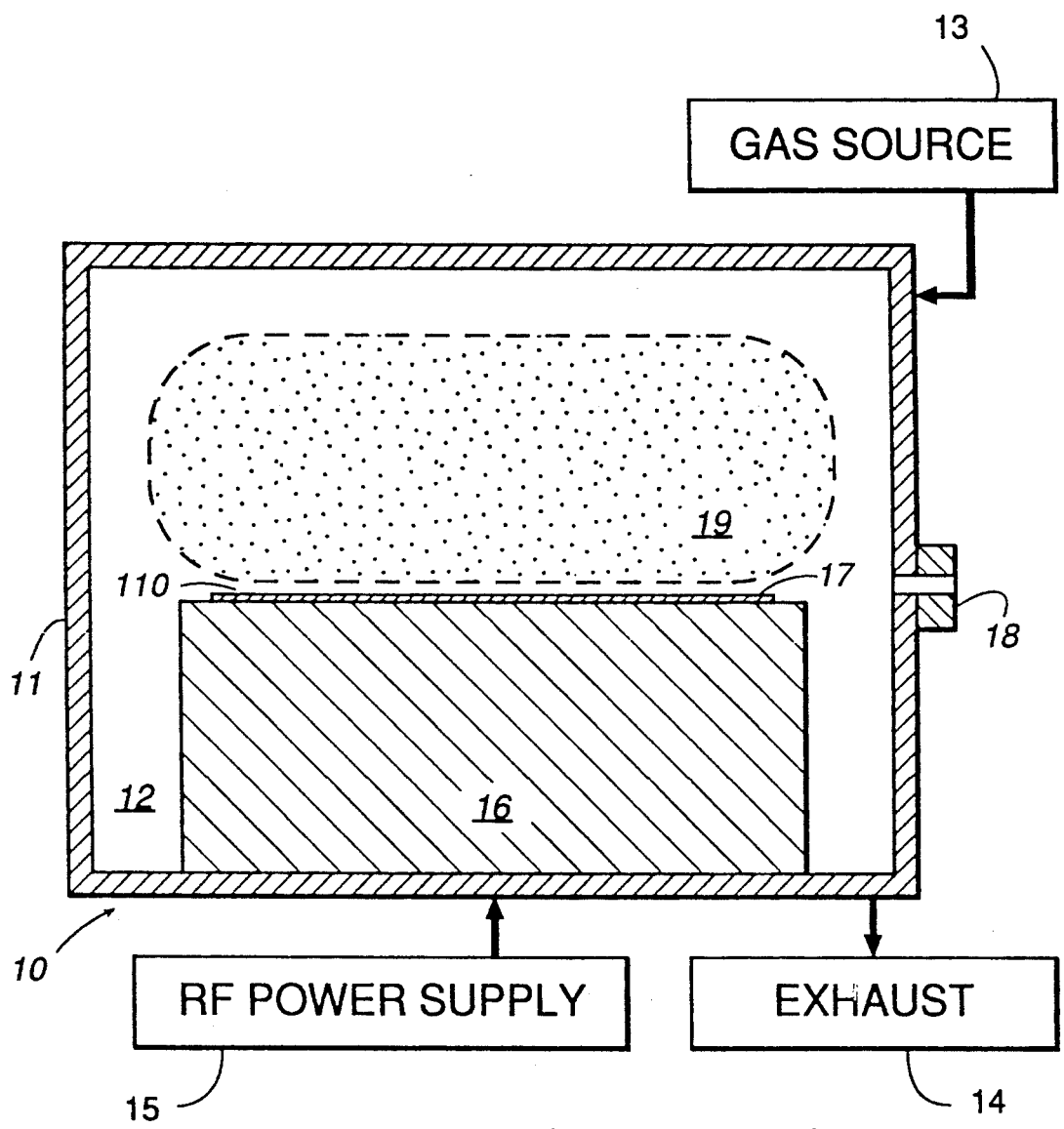
FIG. 1 illustrates a typical wafer processing plasma reactor.

In the figures, the first digit of a reference numeral indicates the first figure in which is presented the element indicated by that reference numeral.

Since the present invention is an improvement to conventional magnetically-enhanced plasma reactors, an explanation of the invention is best preceded by a description of a conventional plasma reactor.

Figure 2A:
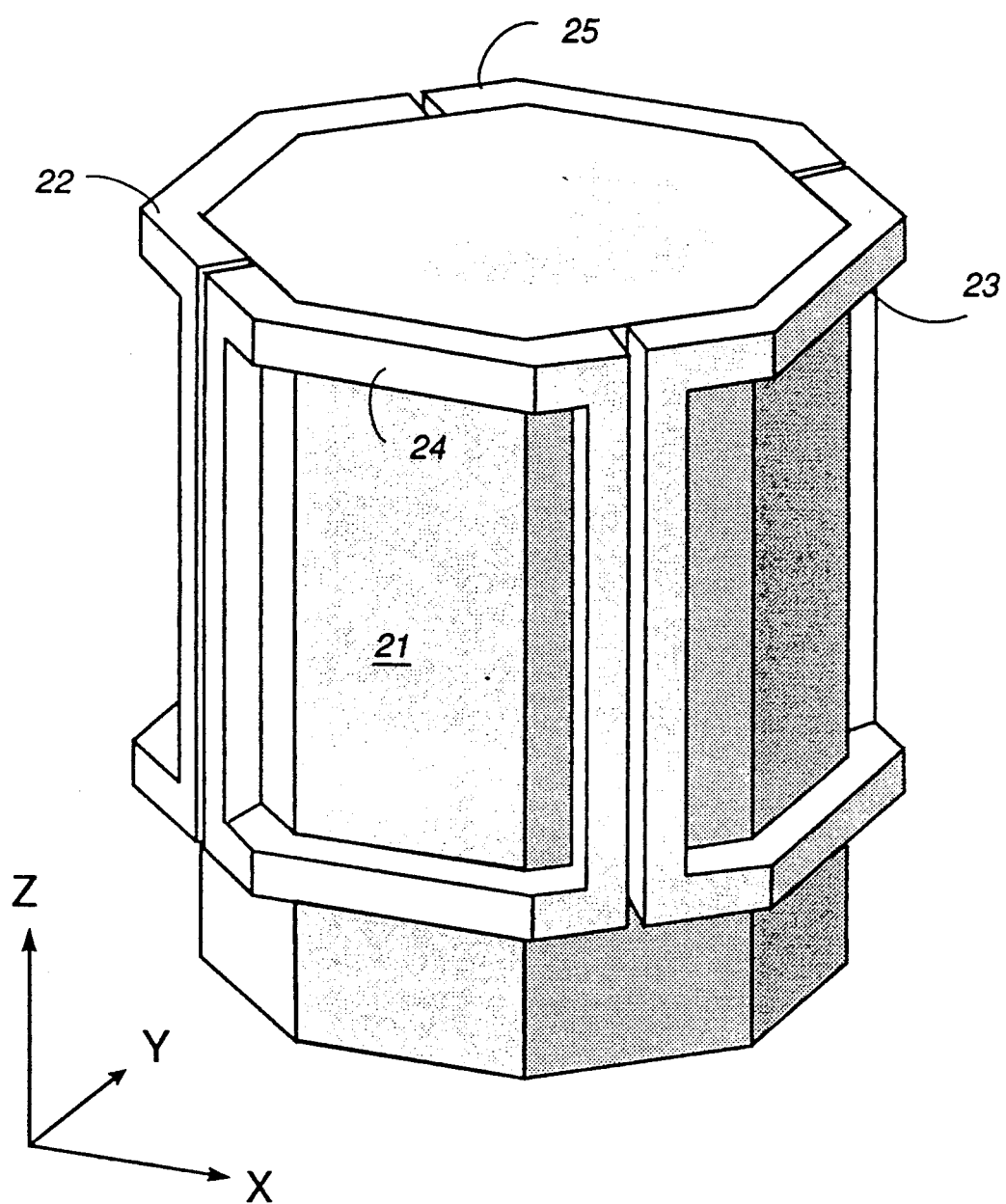
FIGS. 2A–2C are respectively a perspective view, a top cross-sectional view and a side cross-sectional view of the model 5000E from Applied Materials, Inc..
Figure 2B:
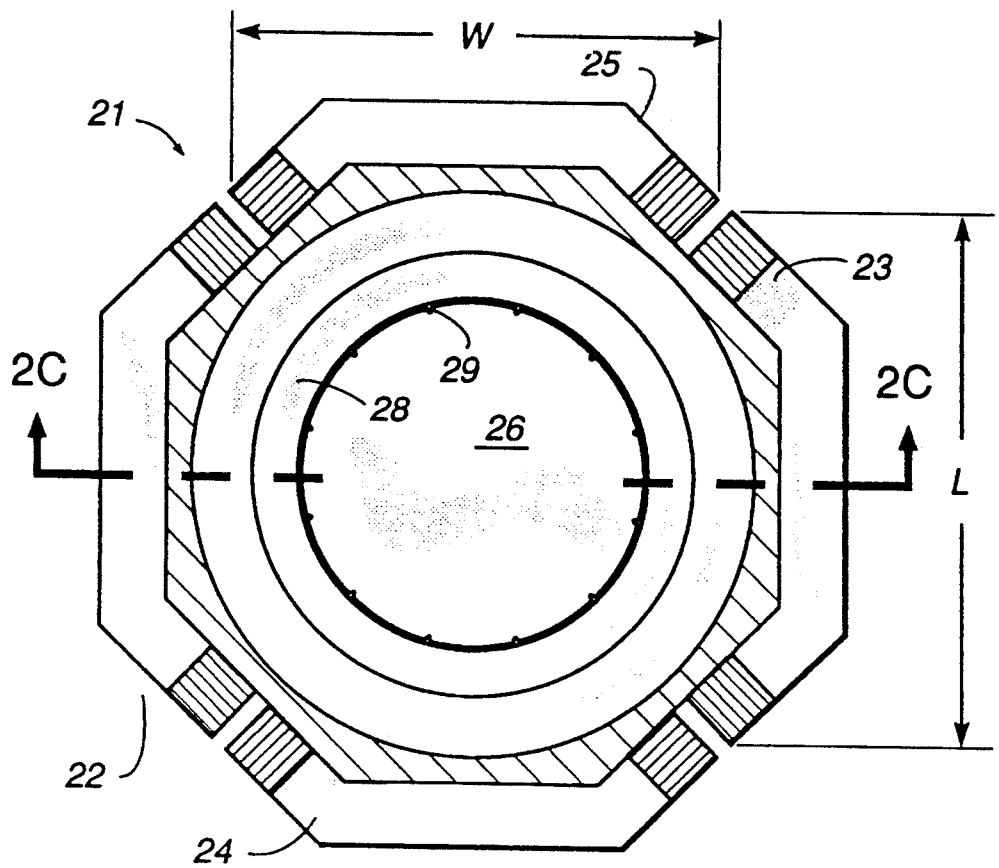
Figure 2C:
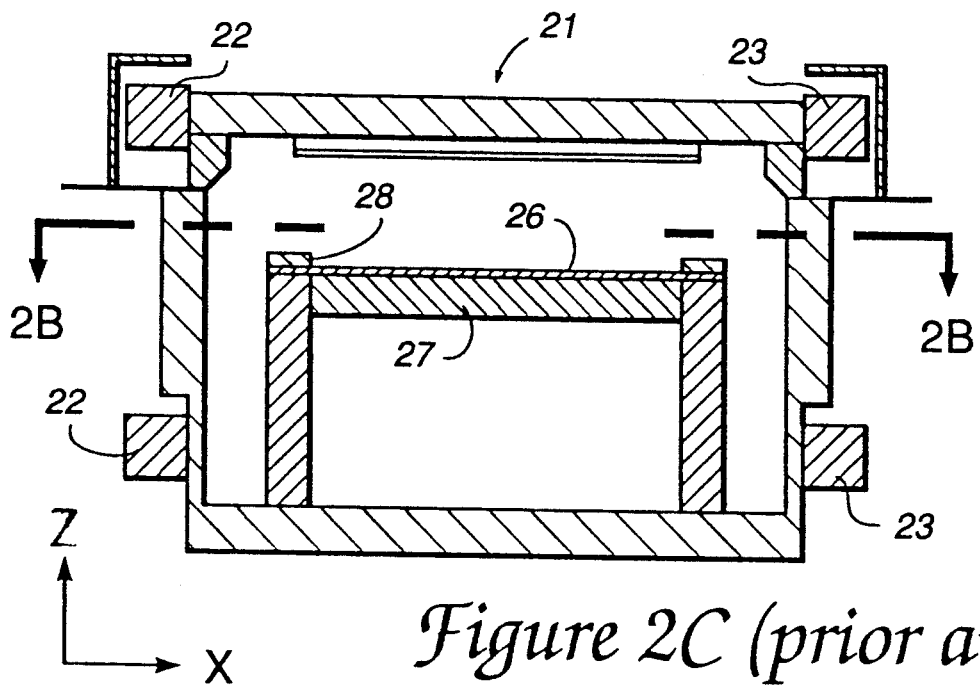

FIGS. 2A–2C are respectively a perspective view, a top cross-sectional view and a side cross-sectional view of a prior art magnetically-enhanced plasma reactor, model 5000E from Applied Materials, Inc. The wafer is oriented parallel to the x-y plane of this figure and the z-axis is centered within this reactor. A pair of electromagnetic coils 22 and 23 produce the x-component of the magnetic field within reactor 21 and a pair of coils 24 and 25 produce the y-component of the magnetic field within reactor 21. These two components are both sinusoidal and shifted in phase by 90 degrees to produce the rotating magnetic field within the reactor. The length L of coils 22 and 23 is longer than the length W of coils 24 and 25 in order to enable wafers to be transported through coil 23 and a slit valve into and out of the reactor processing chamber. Lengths L and W are 13.3 and 11.1 inches, respectively.

As illustrated in top cross-sectional view 2B and top cross-sectional view 2C, respectively, the perimeter of a wafer 26 is pressed into contact with a pedestal 27 by a clamp ring 28. Ring 28 presses wafer 26 against pedestal 27 with sufficient force to enable a sufficient pressure of gas to be trapped between the pedestal and wafer that this gas significantly facilitates cooling of the wafer during processing. This ring includes a set of projections 29 that introduce some deviation from axial symmetry of the reactor processing chamber.

Figure 3:
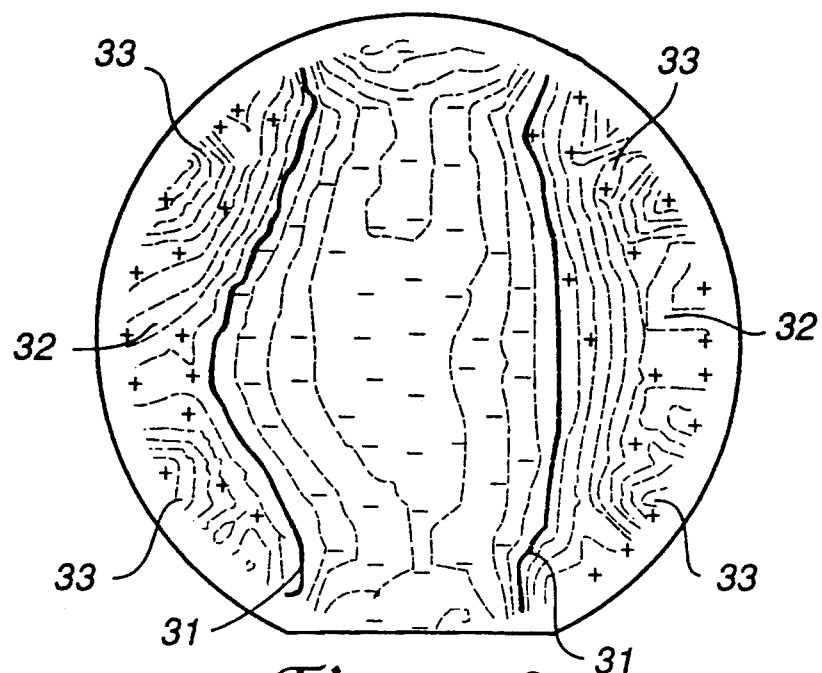
FIG. 3 illustrates the uniformity of the rate of etching of an oxide layer on a 200 mm wafer etched in a reactor of the type illustrated in FIGS. 2A–2C.

FIG. 3 illustrates the uniformity of the rate of etching of an oxide layer on a 200 mm wafer etched in a reactor of the type illustrated in FIGS. 2A–2C. The locus of points of median thickness are indicated by the two dark lines 31 that extend approximately vertically in this figure. Each contour line illustrates a change of 1% from neighboring contour lines. Regions referenced by pluses have greater than average etch rate and regions referenced by minuses have less than average etch rate. Ninety five percent of the measured points have an etch depth within 13% of the mean. More significantly, this pattern exhibits a regularity that indicates that there is a systematic process nonuniformity that is the primary cause of this etch rate variation. Some nonuniformity exists because the Faraday shield 40 (illustrated in FIG. 4) is omitted on the side of this reactor that interfaces with a robot chamber that transfers wafers between various process chambers arranged around the robot. However, as is illustrated in FIGS. 4A–4C, there are other causes of this nonuniformity.

Figure 4A:
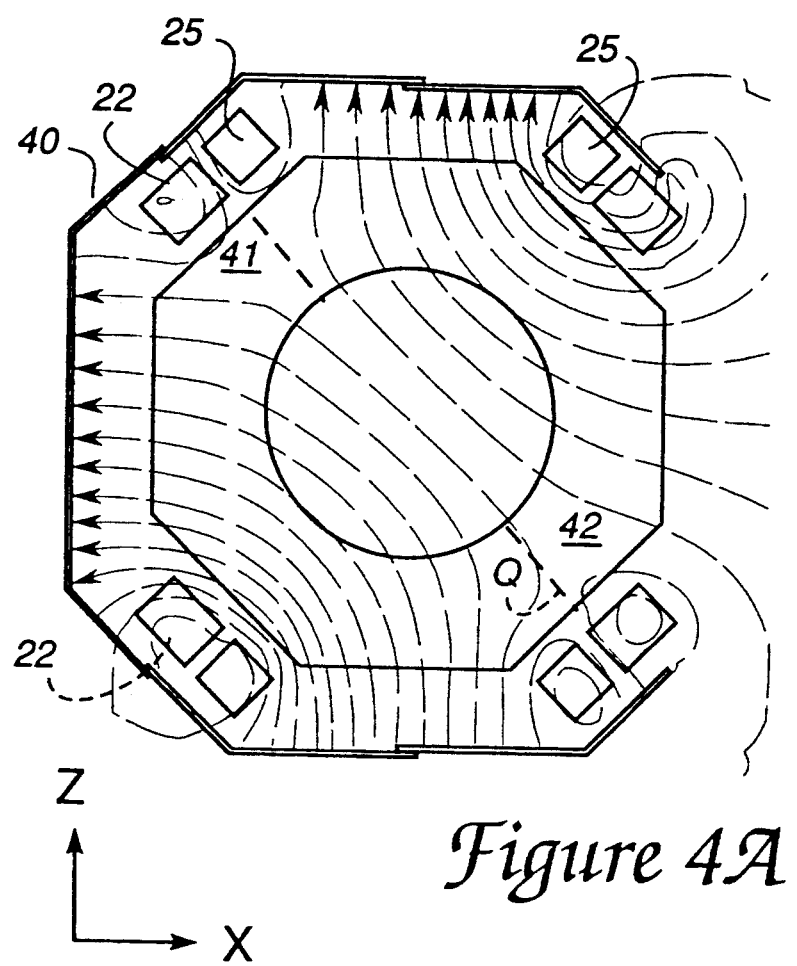
FIG. 4A is a top view of the magnetic field lines at a time at which the x-y component of the magnetic field is to point in the direction 135 degrees counterclockwise from the x-axis.
Figure 4B:
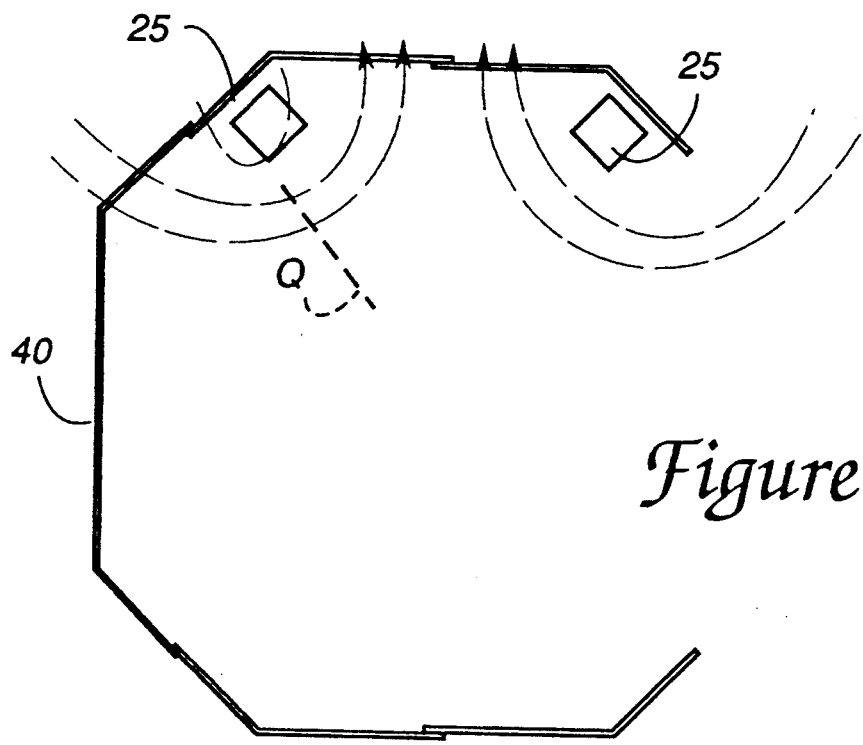
FIG. 4B illustrates the magnetic field produced within the processing chamber by a single coil.
Figure 4C:
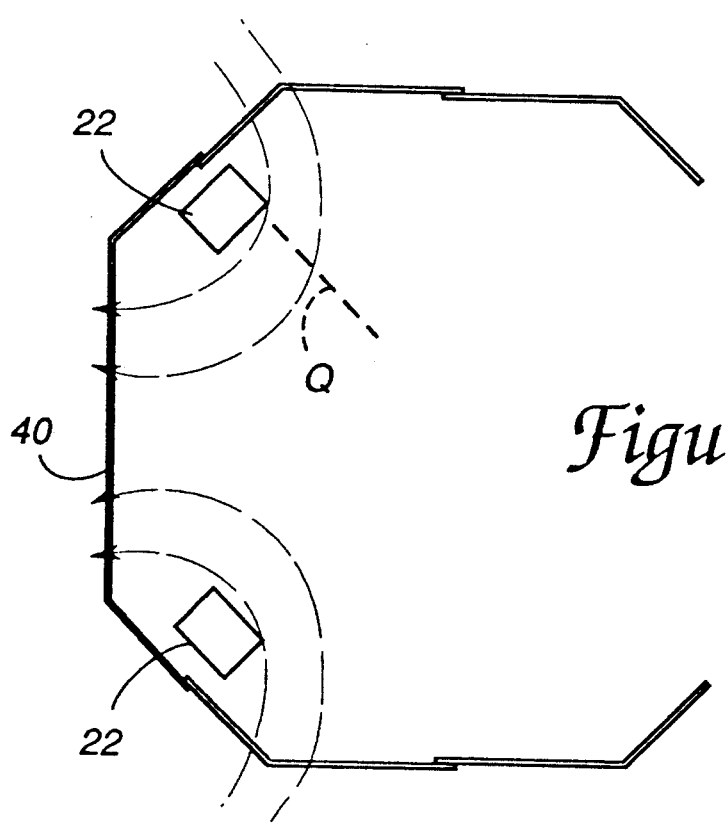
FIG. 4C illustrates the magnetic field produced within the processing chamber by a single coil having its axis oriented perpendicular to the coil of FIG. 4B.

FIG. 4A is a top view of the magnetic field lines at a time at which the x-y component of the magnetic field is to point in the direction 135 degrees counterclockwise from the x-axis. At this time, electromagnetic coil 22 pulls the magnetic field through this coil in the minus x direction toward a Faraday plate 40 and electromagnetic coil 25 pulls the magnetic field through this coil in the positive y direction. The portion of the field produced by coil 25 is shown in FIG. 4B and the portion of the field produced by coil 22 is shown in FIG. 4C.

These figures illustrate that sources of the process rate nonuniformity are nonuniformities in the magnetic field within the processing chamber. The inequality between the length L of coils 22 and 23 and the length W of coils 24 and 25 is believed to produce part of this nonuniformity. In this particular case, the length W is less than the length L so that, for equal magnitudes of current in coils 22–25, the magnetic field will be squeezed into a smaller region through coils 22 and 23 than through coils 24 and 25. This produces a time averaged field that is stronger near coils 22 and 23 than near coils 24 and 25 and causes the increased process rate at the left and right side regions 32 of the wafer illustrated in FIG. 3. This nonuniformity is referred to herein as the "bilateral nonuniformity".

Additional nonuniformities exist in the four corners of FIG. 3. A possible explanation of these nonuniformities is illustrated in FIGS. 4A–4C. When only coil 25 is driven to produce an upward magnetic field through this coil, the field has the shape illustrated in FIG. 4B. When only coil 22 is driven to produce a magnetic field leftward through this coil, the field has the shape illustrated in FIG. 4C. Therefore, when these fields are added, such as when these two electromagnets are to produce at the wafer a substantially spatially uniform field directed toward the upper left hand corner of FIGS. 4A–4C, along dashed line Q there is a significant amount of cancellation between these two fields in the region of this dashed line. This produces a reduced magnetic field in this region, thereby producing the increased spacing between the field lines of FIG. 4A (recall that the spacing between lines in such field line drawings is an indication of the strength of the field). At this same instant of time in the upper right hand corner of FIG. 4A, the fields from coils 23 and 25 add constructively, producing an extra large field in this region. Therefore, the total field produced by coils 22–25 is not a spatially uniform field that temporally varies only in direction, it also varies spatially, with particularly large variation in the four regions. Because of the interactions between field strengths and plasma ion densities are not linear, even though the constructive and destructive addition of the magnetic fields from coils 22–25 average out, the effect on process rate does not average out. As can be seen in FIG. 3, the highest average etch rate occurs in the four corners 33 of FIG. 4A. This nonuniformity is referred to herein as the "quadrilateral nonuniformity".

Figure 5A:
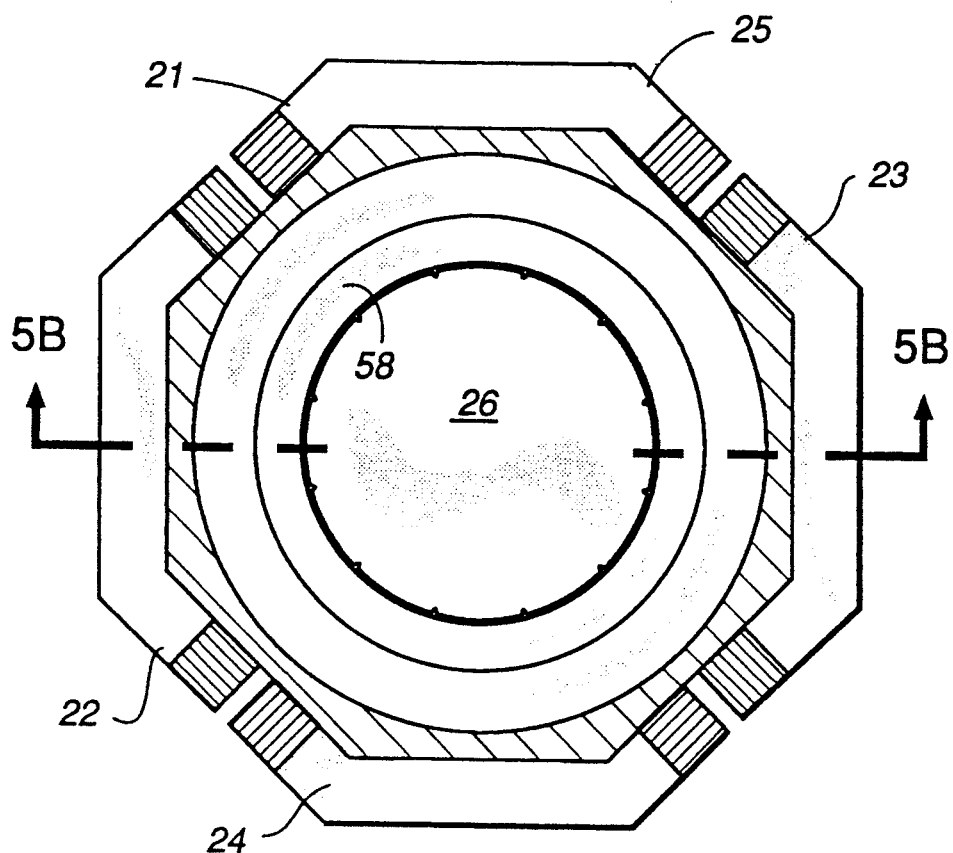
Figure 5B:
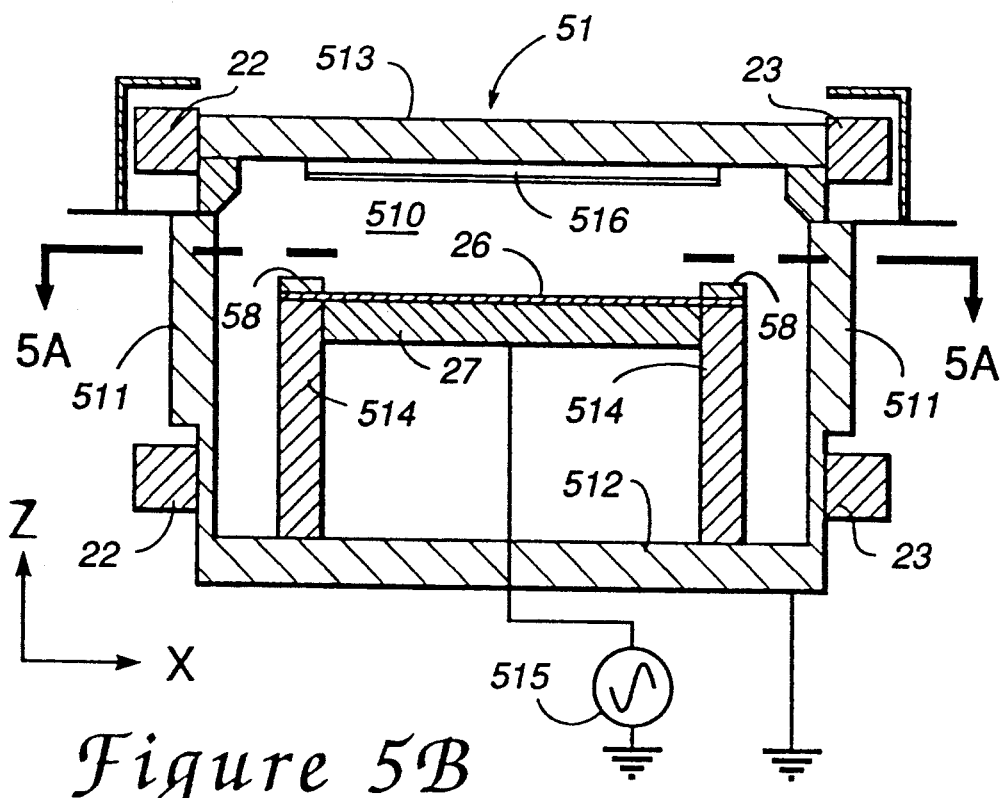

The preferred embodiment of the present invention is the wafer processing plasma reactor 51 illustrated in FIGS. 2A, 5A and 5B. This reactor is similar to the prior art reactor 21 of FIGS. 2A–2C, except that it has been modified (a) to utilize a clamping ring 58 that is cylindrically symmetric, and (b) to include magnetic material positioned within a processing chamber 510 to optimize the uniformity of wafer processing.

Processing chamber 510 is enclosed by a set of walls 511–513 consisting of a side wall 511, a bottom wall 512 and a top wall 513. These walls are conductive and grounded so that they function as the anode for a plasma process within chamber 510. The magnetic material is contained within a conductive pedestal 27. The location, quantity and type of magnetic material is selected to improve the uniformity of processing a wafer 26 transferred into the processing chamber.

FIGS. 2A, 5A and 5B are respectively a perspective view, a side cross-sectional view and a top cross-sectional view of reactor 51. A wafer 26 is oriented parallel to the x-y plane of this figure and the z-axis is centered within this reactor. A pair of electromagnetic coils 22 and 23 produce the x-component of the magnetic field within reactor 21. A pair of coils 24 and 25 produce the y-component of the magnetic field within reactor 21. These two components are both sinusoidal and shifted in phase by 90 degrees to produce a rotating magnetic field within the reactor. The length L of coils 22 and 23 is large enough to enable wafers to be transported through coil 23. This results in a length L of 13.3 inches. In order to also locate coils 24 and 25 closely spaced from the reactor walls, coils 24 and 25 have a length W of 11.1 inches.

As illustrated in side and top cross-sectional view 5A and 5B, respectively, the perimeter of a wafer 26 is pressed into contact with a pedestal 27 by a clamping ring 58. This ring is cylindrically symmetric so that it does not introduce any noncylindrically symmetric components to the wafer process within reactor 51. Process gases are supplied into this chamber through a shower head type gas inlet 516.

An rf power source is connected to pedestal 27, which functions as the plasma chamber cathode. The walls of the reactor are grounded and function as the plasma chamber anode. Elements 514 are insulators to enable pedestal 27 to be driven to a voltage different from walls 511-513. An rf source 515 is connected to pedestal 27 so that this pedestal functions as a cathode for the plasma process.

FIG. 6 illustrates a ring 61 of magnetic material that is included in pedestal 27 to correct the bilateral nonuniformity in the process rate (e.g., the bilateral elevated process rate indicated by the increased etch rate at the left and right sides 32 of the wafer in FIG. 3). This ring has a circular perimeter 62 and is wider on its left side 63 and right side 64 than at its top and bottom regions. This ring is inserted into pedestal 27 near the top surface of the pedestal in an orientation that locates sides 63 and 64 below the regions of process chamber 510 in which occur the bilateral process rate elevation exhibited in the bilateral regions of increased coating thickness in the wafer of FIG. 3. The process rate in process chamber 510 is reduced in those regions of the wafer located above the magnetic areas of ring 61. The thickness of ring 61, its lateral profile and the spacing of this ring below the top surface of the pedestal are selected to substantially eliminate the bilateral nonuniformity in process rate. The magnetic material in the processing chamber reduces the magnetic field and changes the direction of the magnetic field in regions near such magnetic material, thereby reducing the ionization in such regions. This explains the reduced process rate observed in these regions.

FIG. 7 illustrates one of four corner pieces 71 that are inserted into pedestal 27 at positions located below the four peak process rate corner regions 33 of FIG. 3. This increases the amount of magnetic material in these regions, thereby further reducing the process rate in these regions. The thickness of these corner pieces 71 is selected to substantially cancel in these four corner regions the excess process rate above that in the left and right side regions 32.

In an embodiment in which ring 61 and corner pieces 71 are nickel, the thickness for all five of these nickel elements is 0.012 inches. Nickel was used because of its relatively low magnetic permeability compared to other magnetic materials such as iron, cobalt and various alloys of these elements. This low magnetic permeability results in the thickness of these pieces being large enough that they can be easily handled without damage. In addition, this thickness can be easily adjusted to substantially eliminate the bilateral and quadrilateral nonuniformities in the process rate.

As illustrated in FIG. 8, a hollow region 80 in the shape of ring 61 is formed into the pedestal to receive ring 61 such that its top surface is substantially flush with the top surface of the remainder of the pedestal. In addition, four hollow regions 81 are formed (e.g., by machining) in the pedestal to receive the four corner pieces 71 below ring 61. Chamfered hole 65 in ring 61 and threaded holes 82 in pedestal 27 are utilized to bolt ring 61 to the pedestal. Chamfered holes 66 and holes 83 enable a set of four wafer lift pins to extend through the pedestal to lift a wafer onto and/or off of a wafer blade that transfers the wafer into process chamber 510. Threaded holes 67 in the pedestal and holes 72 in corner piece 71 enable these pieces to be bolted to the pedestal. A pedestal cap is then attached onto the pedestal above these magnetic pieces to seal process gases out of these hollow regions. It is advantageous to weld the pedestal cap to the pedestal so that good electrical conductivity is maintained within the cathode structure. The pedestal must therefore exhibit a reproducible impedance at the rf frequency applied to it during plasma processing within process chamber 510.

Figure 9:
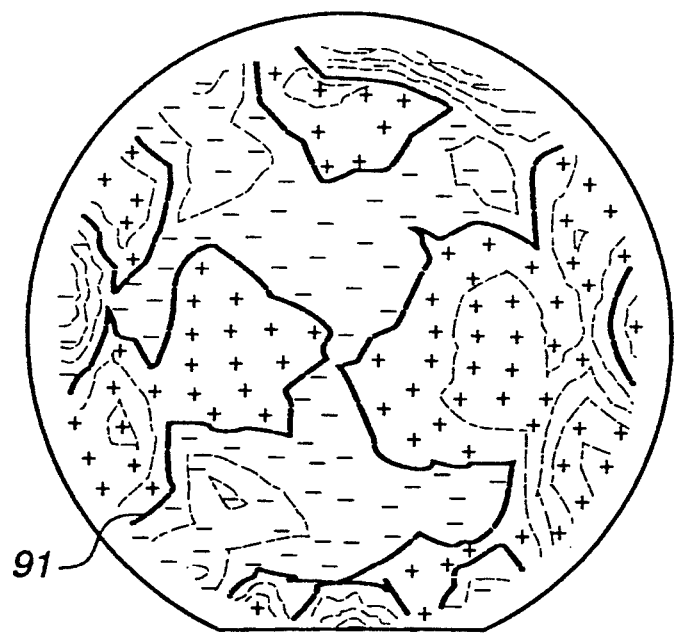
FIG. 9 illustrates the uniformity of etch rate of an oxide layer on a 200 mm diameter wafer that is etched in a reactor that includes the blocks of magnetic material illustrated in FIGS. 6 and 7.

FIG. 9 illustrates the uniformity of etch rate of an oxide layer on a 200 mm diameter wafer that is etched in a reactor that includes the blocks of magnetic material illustrated in FIGS. 6 and 7. The locus of points of median etch rate are indicated by the dark lines 91. Each contour line illustrates a change of 1% from neighboring contour lines. Regions referenced by pluses have greater than average etch rate and regions referenced by minuses have less than average etch rate. Ninety five percent of the points of this wafer exhibit an etch rate of within 4.6% of the median etch rate. Multiple test runs indicate that the deviations in process rate in FIG. 9 are not systematic and therefore will not be removed by adjustment of the shape, thickness and/or magnetic permeability of the magnetic pieces. Therefore, this pattern of magnetic pieces has substantially removed the systematic nonuniformities in the process rate at the wafer.

We claim:

1. A plasma reactor comprising:
   walls that enclose a processing chamber in which a wafer can be transferred for processing;
   a pedestal at which the wafer is transferred for processing;
   means for producing a plasma within this processing chamber;
   means for producing a magnetic field within the processing chamber; and
   within said pedestal, at least one piece of magnetic material that is neither permanently magnetized nor a core of an electromagnet, and that is positioned adjacent to a surface of this pedestal on which said wafer is to be mounted, this magnetic material being positioned adjacent to a region of said pedestal surface at which processing uniformity is improved by a reduction of magnetic field in that region, such that magnetization of this magnetic material, that is induced in response to said produced magnetic field, produces a total magnetic field within the processing chamber having an average systematic spatial deviations in processing rate of said wafer that is less than that in a plasma reactor that differs only in the absence of such magnetic material.

2. A plasma reactor as in claim 1 wherein each portion of the magnetic material has a combination of thickness, permeability and spacing from the top surface of the pedestal such that at least one of these three parameters is selected to reduce average systematic spatial deviations in processing rate of said wafer.

3. A plasma reactor as in claim 1 wherein said means for producing a magnetic field comprises a set of four electromagnetic coils.

4. A plasma reactor as in claim 3 wherein said at least one piece of magnetic material comprises four corner pieces that are located within the processing chamber to reduce a quadrilateral process nonuniformity.

5. A plasma reactor as in claim 4 wherein said coils are activated pairwise to produce a rotating magnetic field within the processing chamber.

6. A plasma reactor comprising:
walls that enclose a processing chamber in which a wafer can be transferred for processing;
a pedestal at which the wafer is transferred for processing;
means for producing a plasma within this processing chamber;
means for producing a magnetic field within the processing chamber;
at least one piece of magnetic material within the processing chamber to adjust the magnetic field within the processing chamber; and
a cylindrically symmetric clamping ring for pressing the wafer against the pedestal.

7. A plasma reactor comprising:
walls that enclose a processing chamber in which a wafer can be transferred for processing;
a pedestal at which the wafer is transferred for processing;
means for producing a plasma within this processing chamber;
means for producing a magnetic field within the processing chamber;
within said pedestal, at least one piece of magnetic material that is neither permanently magnetized nor a core of an electromagnet, and that is positioned such that magnetization of this magnetic material, that is induced in response to said produced magnetic field to produce a total magnetic field within the processing chamber having an average systematic spatial deviations in processing rate of said wafer that is less than that in a plasma reactor that differs only in the absence of such magnetic material; and
a pair of magnetic coils of length L and a pair of magnetic coils of length W, where W is not equal to L, thereby producing a pair of regions of systematic bilateral processing rate nonuniformity.

8. A plasma reactor as in claim 7 wherein said at least one piece of magnetic material includes a ring having a left side and a right side that are each wider than a top region and a bottom region of this ring and that are positioned adjacent to the pair of regions of systematic bilateral processing rate nonuniformity to reduce the systematic bilateral processing rate nonuniformity as a function of at least one of the thickness, magnetic permeability and spacing of this magnetic material from the top surface of the pedestal.

9. A plasma reactor comprising:
walls that enclose a processing chamber in which a wafer can be transferred for processing;
a pedestal at which the wafer is transferred for processing;
means for producing a plasma within this processing chamber;
a set of four coils that are activated pairwise to produce a rotating magnetic field within the processing chamber; and
within said processing chamber, at least one piece of magnetic material that is neither permanently magnetized nor a core of an electromagnet, and that is positioned such that magnetization of this magnetic material, that is induced in response to said produced magnetic field to produce a total magnetic field within the processing chamber having an average systematic spatial deviations in processing rate of said wafer that is less than that in a plasma reactor that differs only in the absence of such magnetic material.

10. A method of improving process uniformity in a magnetically enhanced plasma process in which a workpiece is mounted on a top surface of a pedestal during plasma processing, said method comprising the steps of:
(a) generating a plasma within a processing chamber;
(b) generating in the chamber a magnetic field that enhances a rate of plasma processing of a wafer inserted into this processing chamber;
(c) positioning at least one block of magnetic material, that is neither permanently magnetized nor a core of an electromagnet, within the pedestal, adjacent to said top surface of the pedestal, each such block being positioned at a location in said pedestal such that said magnetic material is magnetized by said magnetic field produced in step (b) to produce a total magnetic field such that the processing rate of the wafer has greater uniformity than without such magnetic material.

11. A method as in claim 10 wherein step (b) comprises generating said magnetic field with two pairs of coils that are powered at a relative phase that produces a rotating magnetic field within the processing chamber.

12. A method as in claim 10 wherein step (c) comprises including within a pedestal in said processing chamber a set of four corners pieces, each corner piece being positioned to reduce a quadrilateral nonuniformity in the processing rate at the wafer.

13. A method of improving process uniformity in a magnetically enhanced plasma process, said method comprising the steps of:
(a) generating a plasma within a processing chamber;
(b) generating in the chamber a magnetic field that enhances a rate of plasma processing of a wafer inserted into this processing chamber;
(c) positioning at least one block of magnetic material within the pedestal, adjacent to a surface of the pedestal at which a wafer is to be mounted for processing, at locations such that the processing rate of the wafer has greater uniformity than without such magnetic material;

wherein step (c) comprises including, within a pedestal in said processing chamber, a ring of magnetic material having a left side and a right side that are each wider than a top region and a bottom region of this ring and that are positioned adjacent to the pair of regions of systematic bilateral processing rate nonuniformity reduce a bilateral nonuniformity in the processing rate at the wafer.

14. A method as in claim 13 wherein step (c) comprises including within a pedestal in said processing chamber a set of four corner pieces, each corner pieced being positioned to reduce a quadrilateral nonuniformity in the processing rate at the wafer.

* * * * *